(12) United States Patent
Oganesian et al.

(10) Patent No.: US 8,512,491 B2
(45) Date of Patent: Aug. 20, 2013

(54) DUAL WAFER SPIN COATING

(75) Inventors: Vage Oganesian, Palo Alto, CA (US); Belgacem Haba, Saratoga, CA (US); Ilyas Mohammed, Santa Clara, CA (US); Piyush Savalia, Santa Clara, CA (US); Craig Mitchell, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 356 days.

(21) Appl. No.: 12/974,611

(22) Filed: Dec. 21, 2010

(65) Prior Publication Data

US 2012/0152433 A1 Jun. 21, 2012

(51) Int. Cl.
*B32B 41/00* (2006.01)

(52) U.S. Cl.
USPC ............ 156/64; 156/350; 156/351; 156/358; 156/360; 156/361; 156/367; 156/378; 156/379; 156/74; 156/87; 156/88

(58) Field of Classification Search
USPC .............. 156/64, 350, 351, 358, 360, 361, 156/367, 378, 379, 74, 87, 285, 286, 381
See application file for complete search history.

(56) References Cited

U.S. PATENT DOCUMENTS

| | | | |
|---|---|---|---|
| 6,231,705 B1 * | 5/2001 | Kanashima et al. | 156/74 |
| 6,613,170 B1 * | 9/2003 | Ohno et al. | 156/64 |
| 2002/0025652 A1 * | 2/2002 | Yanagita et al. | 438/406 |
| 2008/0210383 A1 * | 9/2008 | Hirata | 156/498 |
| 2008/0245472 A1 * | 10/2008 | Hirata et al. | 156/264 |

* cited by examiner

*Primary Examiner* — Katarzyna Wyrozebski Lee
*Assistant Examiner* — Joshel Rivera
(74) *Attorney, Agent, or Firm* — Lerner, David, Littenberg, Krumholz & Mentlik, LLP (57) ABSTRACT

A method of bonding a first substrate and a second substrate includes the steps of rotating first substrate with an adhesive mass thereon, and second substrate contacting the mass and overlying the first substrate, controlling a vertical height of a heated control platen spaced apart from and not contacting the second substrate so as to control a temperature of the adhesive mass, so as to at least one of bond the first and second substrates in alignment with one another, or achieve a sufficiently planar adhesive interface between the first and second substrates.

32 Claims, 7 Drawing Sheets

DUAL WAFER SPIN COATING

BACKGROUND OF THE INVENTION

In the fabrication of microelectronic assemblies, it may be necessary to bond two or more substrates such as semiconductor wafers together. Some existing methods of bonding require the application of a bonding material to one or both substrates, such as wafers, then heating the bonding material to cause it to flow, and eventually curing the bonding material to form a bond. Various methods exist for performing each of these steps. Nonetheless, despite all of the effort which has been devoted to improving upon bonding techniques for two or more substrates, there are unmet needs for further improvements.

SUMMARY OF THE INVENTION

The presently disclosed methods are directed to improving upon techniques for bonding two or more substrates. Among others, the present invention discloses methods of bonding at least two substrates that can help to achieve better alignment between two substrates, as well as provide for a sufficiently planar bonding material interface between the first and second substrates.

In one aspect of the present invention, a method of bonding a first substrate and a second substrate is disclosed that includes the steps of while rotating a first substrate with an adhesive mass thereon, and second substrate contacting the mass and overlying the first substrate, controlling a vertical height of a heated control platen spaced apart from and not contacting the second substrate so as to control a temperature of the adhesive mass, so as to at least one of bond the first and second substrates in alignment with one another, or achieve a sufficiently planar adhesive interface between the first and second substrates.

In one embodiment of this aspect of the invention, the method further includes receiving a first signal representative of a position of second substrate while rotating the first substrate with the adhesive mass thereon; using the first signal to generate a control signal; and using the control signal to adjust the vertical height of the second substrate.

In another embodiment of this aspect of the invention, the step of using the control signal is performed so as to bond the first and second substrates in alignment with one another.

In another embodiment of this aspect of the invention, the step of using the control signal is performed so as to achieve a sufficiently planar adhesive interface between the first and second substrates.

In another embodiment of this aspect of the invention, the first signal is representative of a misalignment of the second substrate in a direction parallel to the top surface of the first substrate.

In another embodiment of this aspect of the invention, the step of receiving a first signal includes generating the first signal by detecting positions of fiducials of the first and second rotating substrates.

In another embodiment of this aspect of the invention, the step of receiving a first signal includes generating the first signal by detecting positions of notches of the first and second rotating substrates.

In another embodiment of this aspect of the invention, the heated control platen rotates.

In another embodiment of this aspect of the invention, the method further includes controlling the rotation of the heated control platen so as to influence the movement of the second wafer.

In another embodiment of this aspect of the invention, the step of controlling the rotation of the heated control platen adjusts a position of the second wafer in at least one of a direction parallel to or a direction transverse to the surface of the first wafer.

In another embodiment of this aspect of the invention, the heated control platen has a central portion overlying the second substrate and a wall extending from the central portion so as to create a chamber.

In another embodiment of this aspect of the invention, the wall extends adjacent the edge of the second substrate.

In another embodiment of this aspect of the invention, the wall extends adjacent the edge of the first substrate.

In another embodiment of this aspect of the invention, the step of controlling the vertical height of the heated control platen includes changing the vertical height of the heated control platen while rotating the first and second substrates with the bonding material therebetween.

In another embodiment of this aspect of the invention, the method further includes admitting a gas through an inlet during said rotating.

In another embodiment of this aspect of the invention, the method further includes evacuating a volume surrounding said first and second substrates at least one of prior to or during said rotating.

In another aspect of the present invention, a method of bonding substrates includes the steps of while rotating a first substrate with an adhesive mass thereon, and a second substrate contacting the mass and overlying the first substrate, receiving a first signal representative of a position of the second substrate; using the first signal to generate a control signal and using the control signal to control a movement of a control platen adjacent to the second substrate so as to at least one of: bond the first and second substrates in alignment with one another, or achieve a sufficiently planar adhesive interface between the first and second substrates.

In one embodiment of this aspect of the present invention, the movement includes a rotational movement.

In another embodiment of this aspect of the invention, the movement includes a vertical movement.

In another embodiment of this aspect of the invention, the movement only includes a vertical movement.

In another embodiment of this aspect of the invention, the control platen does not rotate.

In another embodiment of this aspect of the invention, the control signal controls a rate of rotation of the control platen.

In another embodiment of this aspect of the invention, the first signal is representative of a difference in relative position between the first and second substrates.

In another embodiment of this aspect of the invention, the first signal is representative of rotational misalignment between the first and second substrates.

In another embodiment of this aspect of the invention, the first signal is representative of a misalignment of the first substrate in a direction parallel to the top surface of the second substrate.

In another embodiment of this aspect of the invention, the step of receiving a first signal includes generating the first signal by detecting positions of fiducials of the first and second rotating substrates.

In another embodiment of this aspect of the invention, the step of receiving a first signal includes generating the first signal by detecting positions of notches of the first and second rotating substrates, wherein notches in the first substrate and second substrate are used to determine the relative position between the first and second substrates.

In another embodiment of this aspect of the invention, the step of using the control signal is performed so as to bond the first and second substrates in alignment with one another.

In another embodiment of this aspect of the invention, the step of using the control signal is performed so as to achieve a sufficiently planar adhesive interface between the first and second substrates.

In another aspect of the present invention, a method of bonding a first wafer and a second wafer includes the steps of while rotating first wafer with an adhesive mass thereon, and second wafer contacting the mass and overlying the first substrate, receiving a first signal representative of a position of second wafer; using the first signal to generate a control signal, and using the control signal to adjust the position of second wafer by controlling a vertical height of a control platen adjacent to second wafer so as to control a movement of air or gas between second wafer and a control platen, so as to at least one of: bond the first and second substrates in alignment with one another, or achieve a sufficiently planar adhesive interface between the first and second wafers.

In another embodiment of this aspect of the invention, the step of using the control signal is performed so as to bond the first and second wafers in alignment with one another.

In another embodiment of this aspect of the invention, the step of using the control signal is performed so as to achieve a sufficiently planar adhesive interface between the first and second wafers.

DETAILED DESCRIPTION

It is often necessary to bond two or more substrates together. The inventors have determined that the spin coating process is one process that can accomplish bonding of such substrates together. During the spin coating process, a substrate, e.g., a wafer, can be placed on a platen and a bonding material can be deposited thereon. A second substrate can be stacked on top of the bonding material. Subsequent rotation of the platen causes both wafers to rotate and increasing the temperatures causes the bonding material to be deposited across the surfaces of the wafers.

Through testing, the inventors have determined, however, that use of the spin coating process presents several challenges. During the bonding process, the first and second substrates are subject to movement in six degrees of freedom: movement along the x, y, and z axis, as well as rotation, pitch, and roll. Due to the numerous degrees of freedom, it can be difficult to distribute the bonding material evenly between surfaces of the substrates. Also, particular challenges exist in achieving proper alignment of the edges of the first and second substrates.

Distribution of the bonding material is dependent upon temperature and the resulting viscosity of the bonding material. If the bonding material does not flow properly, it becomes difficult to evenly distribute the bonding material. This occurs when the bonding material is too viscous to allow centrifugal force to evenly distribute the bonding material across the surfaces of the substrates.

Rotation of the first and second substrates relative to one another during the spin-coating process can also present alignment problems. The first substrate may rotate at a rate which is faster or slower than the second substrate. Alternatively, the first and second substrates may not rotate along the same axis if the first and second substrates begin to move relative to one another. As a result of the differing movements of the first and second substrates, it can be difficult to perfectly align the first and second wafers together.

Embodiments of the invention described herein can provide improved ways of bonding substrates using the spin coating process so as to achieve an at least substantially planar interface between the substrates. In addition, substrates can be bonded together in a manner which improves alignment of the substrates relative to one another. For example, features such as conductive pads on respective wafers can be aligned within alignment tolerances.

FIGS. 1A-1H represent a method of bonding at least two substrates together in accordance with an exemplary embodiment of the present invention. Substrates utilized in the methods described herein typically have a coefficient of thermal expansion of less than 10 parts per million/° C. One or more of the substrates may include a layer of monocrystalline semiconductor material, such as silicon, gallium arsenide or other semiconductor material. Such substrate can embody active circuit elements, i.e., electronic devices such as transistors or diodes, which may be connected together in the form of integrated circuits. One or more of the substrates may be in the form of a wafer, such as an active device wafer embodying active circuit elements or a "blank," e.g., unpatterned semiconductor or dielectric wafer. Alternatively, a substrate may consist essentially of dielectric material.

Figure 1A:
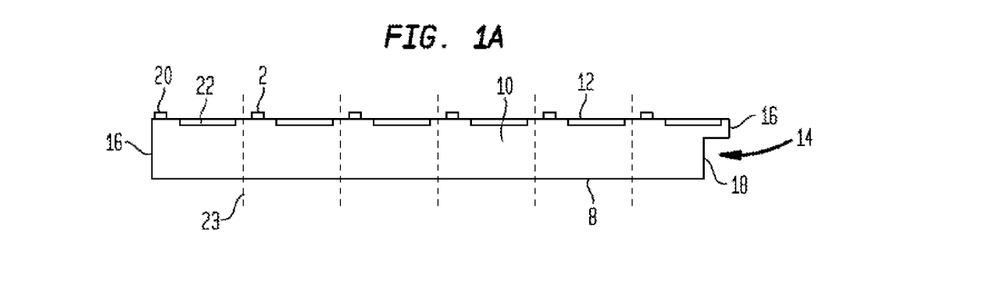
FIGS. 1A-1H depict a method of spin-coating in accordance with an embodiment of the invention.

Referring now to FIG. 1A, a first substrate, such as first wafer 10 is shown. First wafer 10 has a top surface 12 and a bottom surface 8. First wafer 10 includes contacts 20 and active circuitry 22. Dicing lanes 23 extend along boundaries of individual chips of the first wafer 10. Although not required, at least one notch 14 may be formed on first wafer 10. As shown, notch 14 may be formed along at least a portion of an outer edge 16 of first wafer 10. In this embodiment, notch 14 extends inwardly from an edge 16 of first wafer 10 adjacent the bottom surface 8.

Figure 1B:
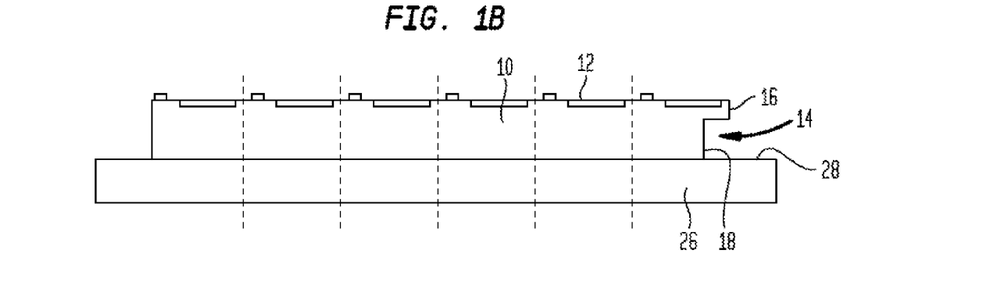
Figure 1C:
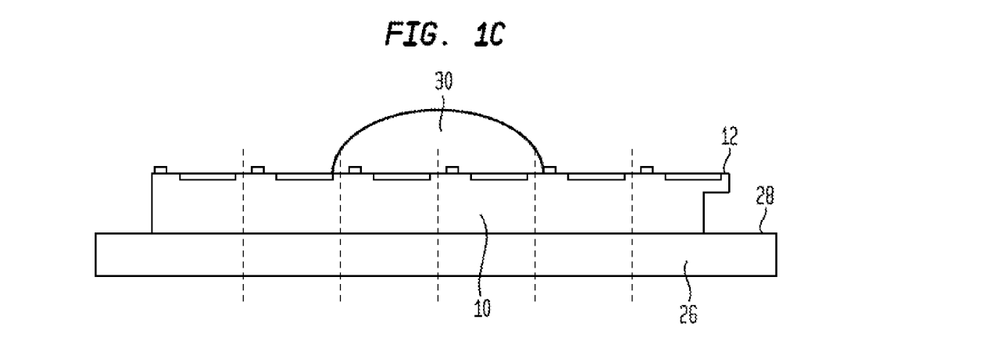
Figure 1D:
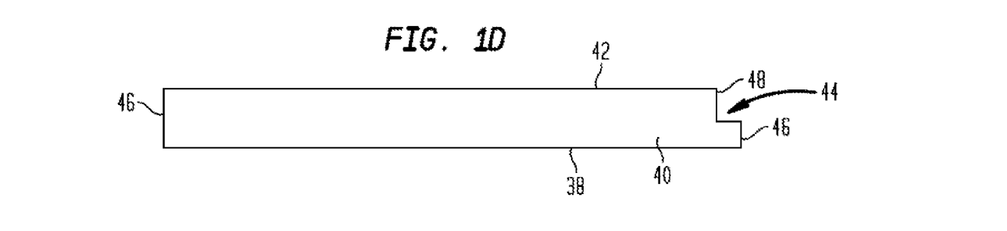
Figure 1E:
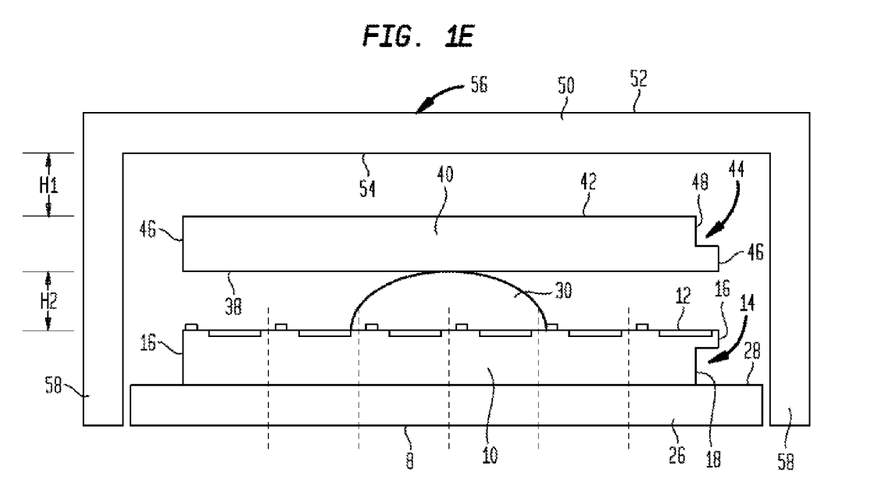

Turning now to FIG. 1B, first wafer 10 may be placed onto a first platen 26 of a spin coating machine or spinner (not shown) (FIG. 1E). When positioned, the bottom surface 8 of first wafer 10 may overlie a major surface 28 of first platen 26. In this embodiment, although not required, first platen 26 may be capable of being heated to a desired temperature via a heating element (not shown). The platen 26 can include or consist essentially of metal or other thermally conductive material, although any suitable material capable of conducting heat may be used.

As shown in FIG. 1C, a bonding material 30 may be placed or deposited on the top surface 12 of first wafer 10. The bonding material 30 may be any type of material capable of providing a bond between two substrates. For example, adhesive material, dielectric material, or the like may be used. In one embodiment, an adhesive polymeric material, such as epoxy, may be used.

Referring now to FIG. 1D, a second substrate, such as second wafer 40 may be provided. In another embodiment, second wafer 40 may be a blank wafer. Second wafer may have a notch 44 extending inwardly from the outer edge 46 of second wafer 40. In one embodiment, second wafer 40, like the first wafer 10, may embody active circuit elements and have contacts exposed at a major surface, e.g., bottom surface 38.

Turning now to FIG. 1E, second wafer 40 may be positioned to overlie the bonding material 30 and first wafer 10. As shown, the bottom surface 38 of second wafer 40 contacts the bonding material 30 and faces the top surface 12 of first wafer 10 above the top surface 28 of first platen 26. Second wafer 40 will be positioned a distance H2 from first wafer 10 that can be defined by the height or thickness of the bonding material 30.

A second platen 50 may be positioned over first platen 26, as well as the first and second wafers 10, 40. Second platen 50 may be formed of metal, but any other material capable of conducting heat may also be utilized. The second platen may have an outer surface 52 and an inner surface 54. Unlike first platen 26, in one embodiment, second platen 50 may include a central portion 56 with a wall 58 extending circumferentially therefrom. In this embodiment, the wall 58 extends at least as far as the bottom surface 8 of first platen 26. The shape of first platen 26 helps to create an area or environment within the interior of the wall 58. The shape of second platen 50 can help to regulate the temperature and/or airflow about the first wafer 10, second wafer 40 and bonding material 30, during the spin-coating process, as discussed in more detail below.

Figure 1F:
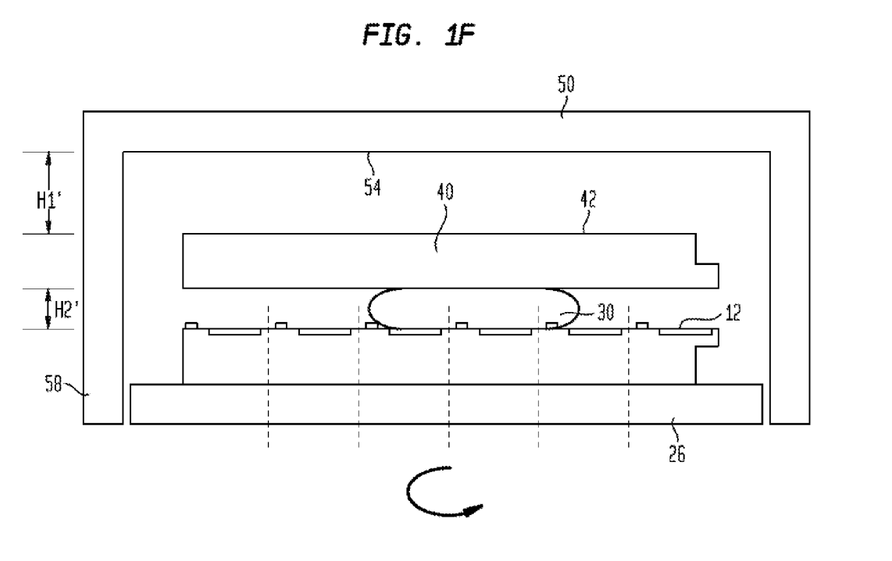

Referring now to FIG. 1F, first platen 26 may be rotated in a clockwise or counter-clockwise direction, thereby causing both first wafer 10 and second wafer 40 to rotate. Second platen 50, which in this embodiment operates as a control platen, may be heated to increase the temperature of the environment within wall 58. When the temperature of the second platen 50 is increased, the temperature of the bonding material 30 also increases, causing the bonding material 30 to flow. Due to the rotation of the first and second platens and the increased flowability of the bonding material 30, centrifugal force can distribute the bonding material 30 between the top surface 12 of first wafer 10 and the bottom surface 38 of second wafer 40.

As the bonding material 30 begins to flow, the height or thickness of the bonding material 30 is reduced. When this happens, the thickness or height H2' (FIG. 1F) of the bonding material 30 is less than the initial thickness or height H2 (FIG. 1E) of the bonding material 30 prior to an increase in temperature of the bonding material 30. As a result, the distance H1' (FIG. 1F) between the top surface of second wafer 40 and the inner surface 54 of second platen 50 is greater than the original distance H1 (FIG. 1E) between second platen 50 and second wafer 40.

Second platen 50 can be considered a control platen which can be used to regulate the area or environment within its wall 58. In this embodiment, second platen 50 helps to control temperature. First, the second platen 50 may be heated or cooled when it is desired to increase or decrease the temperature needed to increase or decrease flowability and/or viscosity of the bonding material 30. Heating of the second platen can be accomplished by any one of several ways, such as by heating the second platen 50 with a heat cartridge in thermal communication therewith. Alternative methods of heating may include resistive heating, use of thermoelectricity, or other known methods. Second, the structure of the second platen aids in achieving a desired temperature. Among other structural improvements, because the wall 58 of the second platen encloses a certain limited space or environment, it is easier to maintain that space or environment at a desired temperature, as compared to maintaining a specific temperature in a much larger space. Third, as shown by the arrow A in FIG. 1G, second platen 50 may be capable of moving upward or downward. The ability of the heated second platen 50 to move closer to and/or away from the first and second wafers 10, 40, as well as the bonding material 30, allows for better control over the temperature of the bonding material 30 and its viscosity during the bonding process. This is because the heated second platen 50 can be brought closer to or further away from the bonding material 30 to increase or decrease the temperature of the bonding material 30.

Figure 1G:
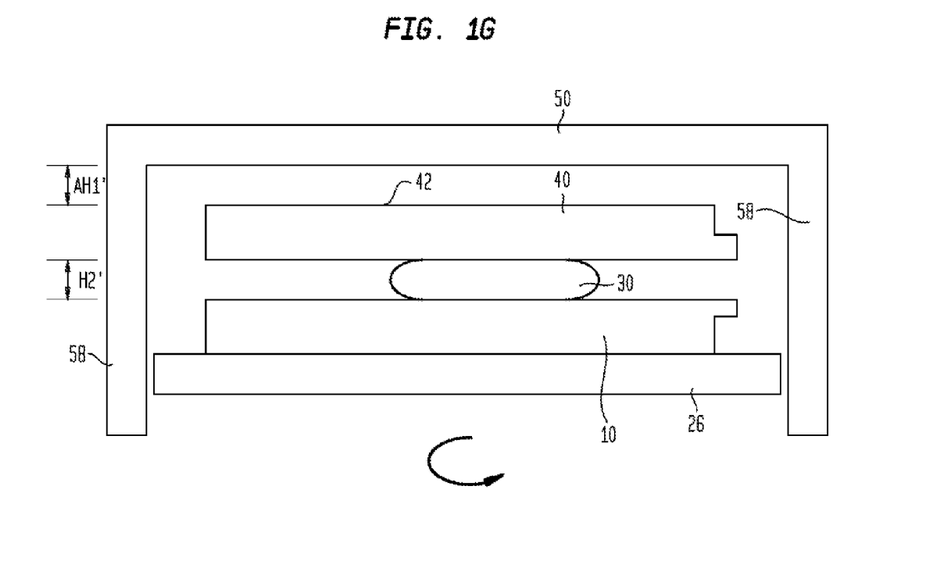

As shown in FIG. 1G, second platen 50 may be moved closer to second wafer 40, such that the adjusted height or distance $A_{H1}'$ between second platen 50 and the top surface 42 of second wafer 40 is less than the initial height or distance H1 (FIG. 1E). The ability of second platen 50 to move or adjust relative to the first and second wafers 10, 40 aids in creating an environment within the interior of second platen 50 which allows for the bonding material 30 to reach or remain at a certain desired temperature that allows for the uniform distribution of the bonding material 30. In one embodiment, the temperature prior to bonding is up to 50° C. In one example in which it is desirable to maintain the bonding material at a temperature of about 80° C., maintaining the temperature of the first and second wafers via the second platen can help achieve this.

As previously discussed, during the spinning process, first wafer 10, which is connected to the first platen 26, may sometimes rotate at a slightly different rate than second wafer 40. For example, the second wafer 40 may rotate at a slightly lower rate than the first wafer 10 due, in part, to inertia and that the bonding material 30, while uncured, permits the second wafer 40 to slip relative to first wafer 10. As a result, the first and second wafers 10, 40 could become misaligned when bonded together. The presence of notches on the wafer as described herein can permit addressing misalignment of the first and second wafers 10, 40 during the bonding process.

In this embodiment, although not required, to ensure that first wafer 10 and second wafer 40 are properly aligned with one another, notches 14 on first wafer 10 and notches 44 on second wafer 40 can be utilized. Notches 14, 44 are visible from the edge of the respective first and second wafers 10, 40. A secondary device (not shown), such as a spectroscope, can be used to determine whether the notches 14, 44 are aligned with one another. For example, if the spectroscope indicates that the notches 14, 44 are not aligned, the operator may determine that it is necessary to adjust second platen 50 in an upward or downward direction to create a condition wherein notches 14, 44 can be aligned. This determination can be made by observing the effects of moving second platen 50 upward or downward. For example, if it is necessary for second wafer 40 to rotate at a greater speed, the platen may be moved closer to the bonding material 30, so as to increase flowability of the bonding material and minimize the amount of resistance caused by the bonding material 30. Alternatively, it may be desired to slow down the speed of rotation of second wafer 40, in which case it may be desired to move second platen 50 further away from the first and second wafers 10, 40 so as to reduce the temperature in the environment and the flowability of the bonding material 30. In alternative embodiments, as discussed herein, movement of the second platen 50 may be automatically adjusted by a control system that will compensate for the needed changes in temperature that will result in the desired flowability of the bonding material 30.

Figure 1H:
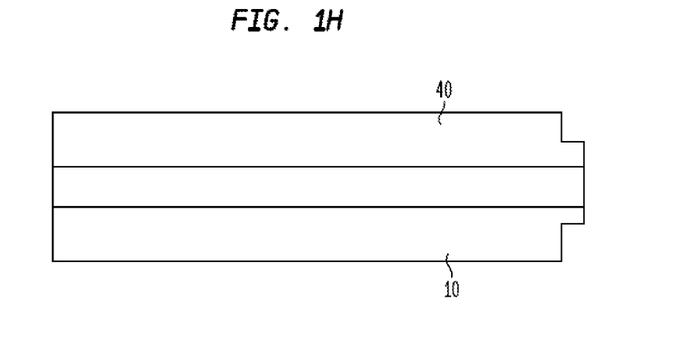

Referring to FIG. 1H, once the bonding material 30 has been distributed across the surfaces of the first and second wafers 10,40, the bonding material 30 may be cured. Thereafter, the bonded first and second wafers 10,40 may be removed from the spinner. As shown, first wafer 10 and second wafer 40 are now bonded together by the bonding material 30 interposed therebetween. The bonded wafers may then be cut into individual units along the dicing lanes 23, each unit including a portion of each of the first and second wafers 10,40.

Figure 2A:
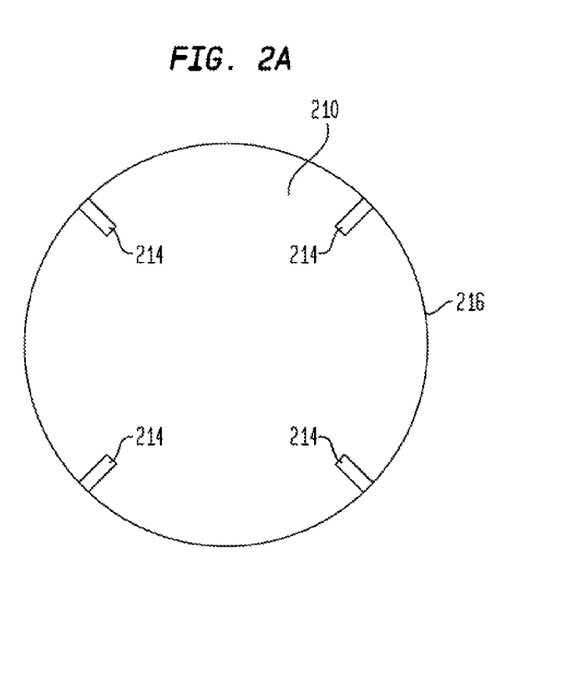
FIG. 2A depicts an alternate embodiment of the wafers shown in FIGS. 1A-1H.
Figure 2B:
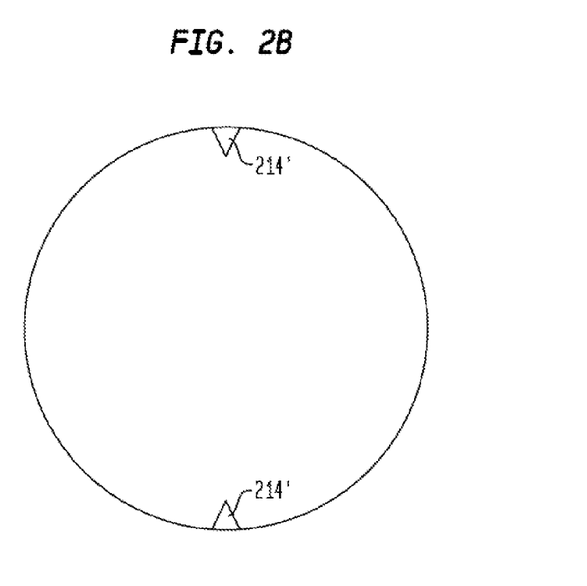
FIG. 2B depicts an alternate embodiment of the wafers shown in FIGS. 1A-1H.

Turning to FIGS. 2A and 2B, an alternative embodiment of bonding is shown. It is to be appreciated that throughout the description of FIGS. 2A and 2B, as well as throughout the application, similar reference numerals will be used to indicate similar elements. In this embodiment, instead of just one notch on a wafer, any alternative form of notches or notch arrangements may be utilized. In FIG. 2A, instead of only one notch on the wafer, more than one notch may be included on a wafer. As shown, four notches 214 may be dispersed along the outer edge 215 of the wafer 210. The notches may be similar in shape to the notches 14,44 shown in FIGS. 1A and 1D. Alternatively, as shown in FIG. 2B, there may be two notches 214 which are triangular in shape. It is to be appreciated that notches may be placed on the wafers 210 in any manner, shape, or pattern desired.

Figure 3:
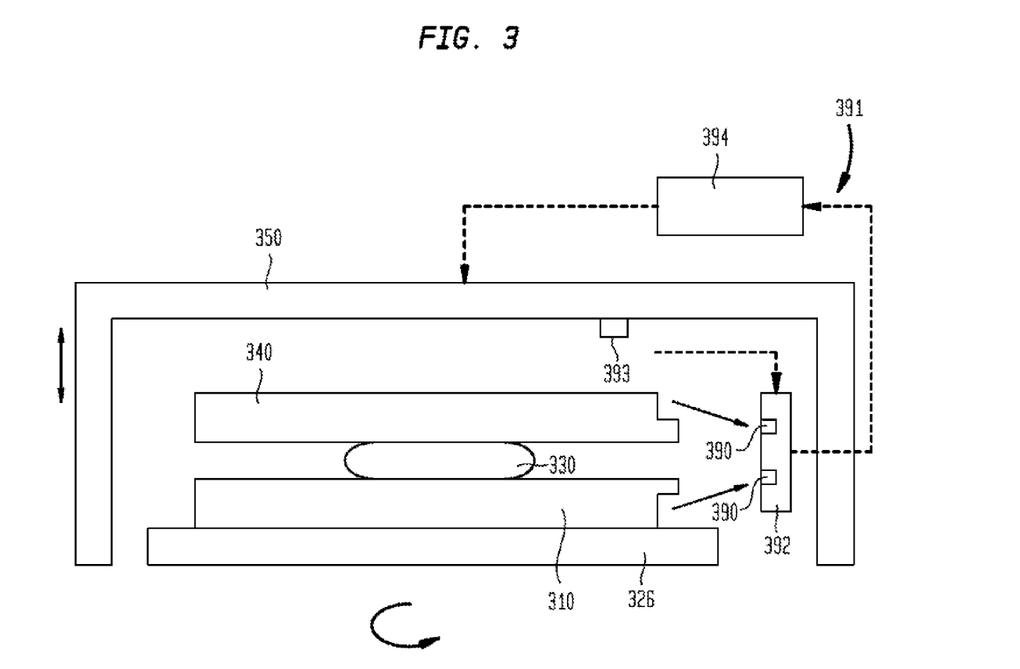
FIG. 3 depicts an alternate embodiment of a method of spin-coating in accordance with an embodiment of the invention.

Referring now to FIG. 3, an alternative embodiment of the present invention is shown. In this embodiment, there is shown a first platen 326, a bonding material 330 overlying the first wafer 310, a second wafer 340 overlying the bonding material 330, and a second platen 350 that overlies first wafer 310, bonding material 330, and second wafer 340. This embodiment is similar to FIG. 1G, except that a separate control system 391 may be utilized to automatically determine whether it is necessary for second platen 350 to move upward or downward and/or whether to increase the temperature of the second platen 350. As shown, the control system 391 may include a detecting unit 392 and an adjustment unit 394. The detecting unit 392 may include sensors 390 capable of detecting and determining the position of the notches 314, 344. The adjustment unit can then determine whether the notches 314,344 are aligned with one another and/or how much misalignment exists between the notch 314 of the first wafer 310 and the notch 344 of the second wafer 340. Once the detecting unit 392 detects the positions of the first and second wafers, the detecting unit 392 will send one or more signals to the adjustment unit. The adjustment unit can then determine whether the notches 314,344 are aligned with one another and/or any offset of the notches 314,344 relative to one another. The adjustment unit 394 will then determine whether it is necessary for the second platen 350 to be moved in an upward or downward direction. For example, if it is determined that the notches 314,340 are not aligned, the adjustment unit 394 may then make a determination that it is necessary to increase the temperature of the environment to increase the flowability of the bonding material 30. To do so, the adjustment unit can provide a control signal causing a mechanism (not shown) coupled to the second platen 350 to cause the second control platen 350 to move downward toward the second wafer 340, thereby increasing the temperature of the bonding material 330 and causing the bonding material 330 to flow more readily. In contrast, if the notches 314,344 are aligned, the adjustment unit will make a determination that it is not necessary to move the second platen 350 at all.

The adjustment unit 394 may also be capable of adjusting the second platen 350 to regulate the temperature within the environment contained within second platen 350 and the resulting flowability of the bonding material 330, as opposed to or in addition to ensuring proper alignment of the notches 314,344. In one embodiment, at least one temperature sensor 393 may be positioned on the second platen 350. The temperature sensor 393 may be capable of determining the temperature of the second wafer 340.

In one embodiment, the control system 391 may be operated so that the temperature of the second wafer 340 is maintained at or close to the temperature of the first wafer 310 throughout the bonding process. In this way, increases or decreases in the temperature of the first wafer 310 are followed by the second wafer 50 340, so as to maintain a flowability and desired characteristics of the bonding material.

In another embodiment, the control system 391 may be operated so that the temperature of the second wafer 340 is maintained in accordance with a predetermined profile over time. In such embodiment, the system might control the second wafer 340 temperature so as to match the temperature called for by the predetermined profile at different points in time. However, in such a case, control over the second wafer 340 temperature might not be in direct relation to the temperature of the bottom wafer.

During operation, when it is determined that the temperature of the second wafer 340 needs to change, the adjustment unit 394 can determine whether the position of the control platen may need to move closer or farther from the second wafer 340 and can determine whether the temperature of the second platen 350 should increase or decrease (e.g., by control of a heating element attached to second platen 350).

Figure 4:
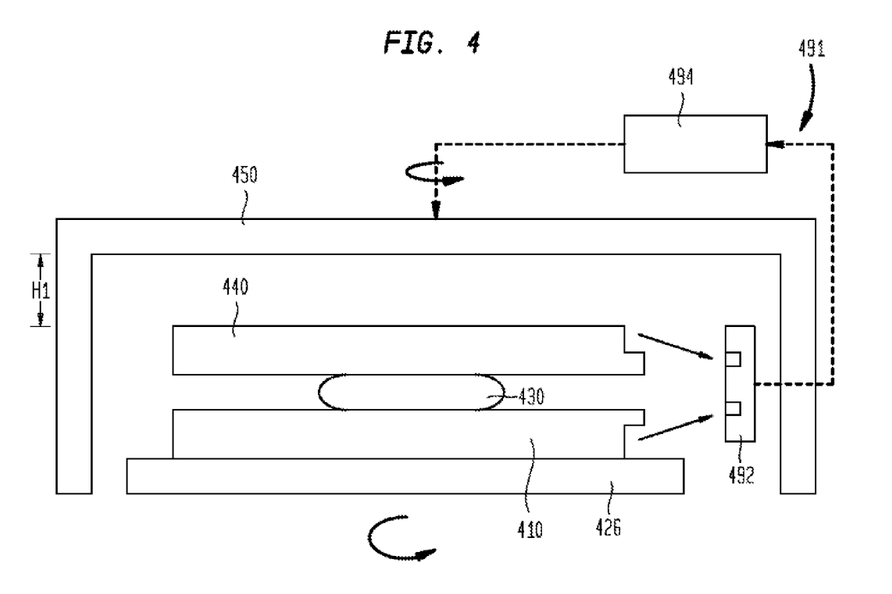
FIG. 4 depicts an alternate embodiment of a method of spin-coating in accordance with an embodiment of the invention.

Referring now to FIG. 4, another alternative embodiment is shown. This embodiment is similar to FIG. 3, except that here, as indicated by the arrows, both first platen 426 and second platen 450 rotate. Either or both first platen 426 and second platen 450 may be heated. As previously discussed, alignment of the second wafer 440 and first wafer 410 will be affected by the rotation rate of the second wafer 440 relative to the first wafer 410. In this embodiment, rotation of the second wafer 440 can be controlled by movement of second platen 450 based upon principles of aerodynamics. The rate of rotation of second platen 450 relative to the second wafer 440 can cause the second wafer 440 to accelerate or decelerate. For example, if second platen 450 is rotating at a lower speed than second wafer 440 or not rotating and is moved toward the second wafer 440, such that the distance H1 between second platen 450 and second wafer 440 is reduced, the rate of rotation of the second wafer 440 decelerates. However, if the second platen is rotating faster than the second wafer, its motion can influence the second wafer's motion and cause it to rotate faster than its current speed. Other combinations of rotational and vertical movement are possible. For example, moving the second platen 450 to a distance further away from the second wafer 440 may have the effect of reducing the influence of the first platen's 426 rotation on the rotation of the second wafer. Therefore, moving the second platen 450 further away when the second platen 450 is rotating more slowly than the second wafer 340 can cause the rotation of the second 340 wafer to accelerate.

A control system 491 may be used to automatically adjust a position or temperature of the second platen 450, or both position and temperature. The control system 491 may include a detecting unit 492 and an adjustment unit 494. A detecting unit 492 can determine the relative rate of rotation of the second wafer 440 relative to the first wafer 410. If the rate of rotation of the second wafer 440 relative to the first wafer 410 is not the same, the detection unit 492 can send a signal to the adjustment unit 494, causing an adjustment in motion or position of the second platen 450. If the rate of rotation of the second wafer 440 needs to be adjusted, the adjustment unit 494 can send a control signal to second platen 450 to cause the second platen 450 to rotate faster or more slowly, to move upward or downward. Such movement will accelerate or decelerate the rotation of the second wafer 440. In contrast, if the rate of rotation of the second wafer 440 needs to be decreased, the adjustment unit can send a control signal to second platen 450 to move second platen 450 downward or closer to the second wafer 440. Such movement will decelerate rotation of the second wafer 440.

Figure 5:
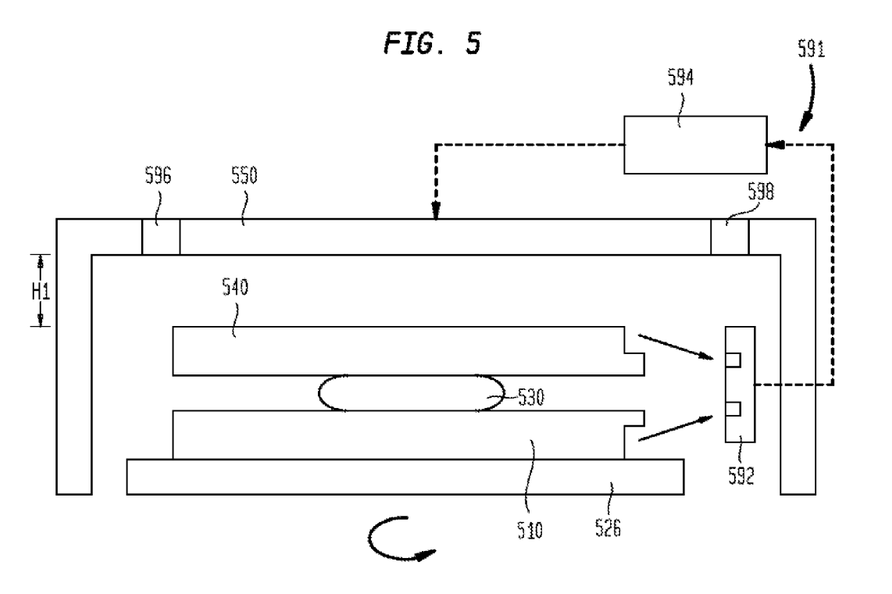
FIG. 5 depicts an alternate embodiment of a method of spin-coating in accordance with an embodiment of the invention.

Referring to FIG. 5, another alternative embodiment of FIG. 3 is shown. Like the embodiment of FIG. 3, only first platen 526 rotates. Second platen 550 is stationary, but includes openings 596, 598. The opening 596 may be connected to a source of gas which can enter through the opening to adjust the volume of gas adjacent or surrounding the wafers 510,540. The opening 598 may be connected to a pump which permits air or gas within the volume defined by second platen to be withdrawn. This allows for an alternate form of aerodynamic control over spinning of the second wafer 540. Instead of rotating second platen 550, as in the previous embodiment, the amount of air within the area defined by second platen 550 can be regulated. Thus, when it is desired to adjust the speed of rotation of the second wafer 540 relative to the first wafer, air or gas can be admitted or withdrawn through the openings 596, 598. Additionally, the distance H1 between the second platen 550 and the second wafer 540 can be adjusted to further increase or decrease the rotation of the second wafers 40.

Figure 6:
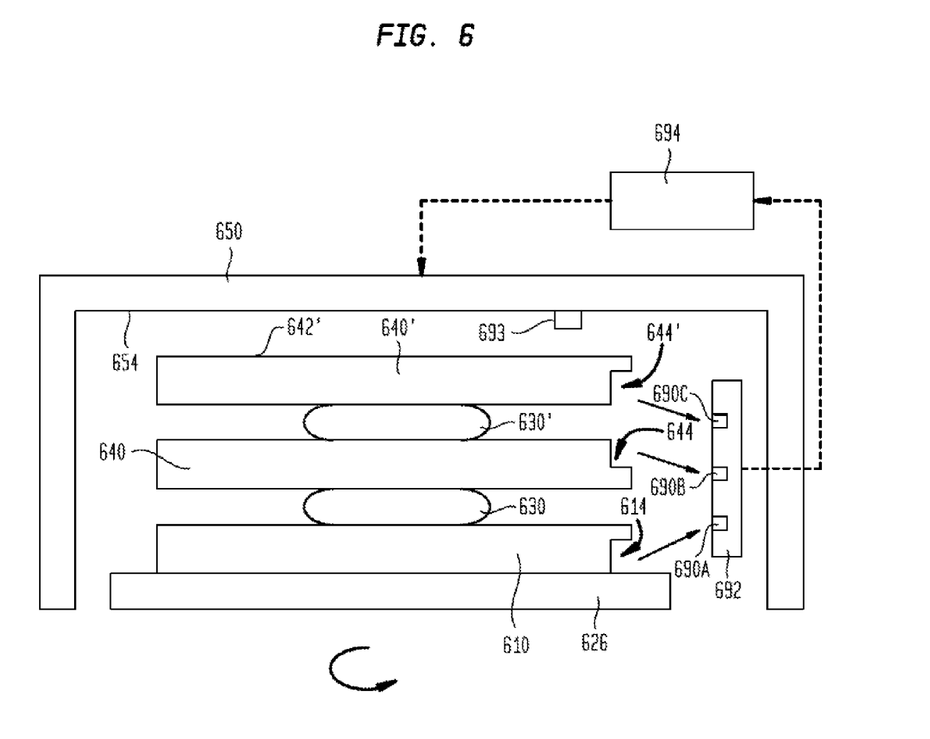
FIG. 6 depicts an alternate embodiment of a method of spin-coating in accordance with an embodiment of the invention.

Referring now to FIG. 6, another embodiment of the present invention is shown. Here, once the bonding material 630 has been completely cured or partially cured, second bonding material 630' may be deposited on the top surface of the second wafer. Thereafter, a third wafer 640' may be provided and positioned to overlie the bonding material 630, the first and second wafers 610,640, and the second bonding material 630'. Changing the viscosity of the bonding material 630 may then be initiated using any of the aforementioned processes alone or in combination with one another. In one example, only first platen 626 may rotate. Second platen 650 may be used to control temperature and rotation of the third wafer 640' based upon the distance of the inner surface 654 of second platen 650 relative to the top surface 642' of the third wafer 640'.

As in the previous embodiments, the second platen 650 may be controlled by a control system, that may include a detecting unit 692 and an adjustment unit 694. The detecting unit 692 may include sensors 690A, 690B, 690C which are capable of detecting the position of the notches 614, 644, 644'. Additionally, at least one temperature sensor 692 may be positioned on the second platen 650 that is capable of determining the temperature of the second wafer 640 and/or the volume adjacent to or surrounding the wafers 610,640,640' and/or the specific temperature of the bonding material 630, 630'. Once the detecting unit 692 makes a determination regarding temperature and/or alignment of the wafers, the detecting unit 692 will send a signal to the adjustment unit 694. The adjustment unit 694 will then determine what adjustment to make in temperature and/or alignment of first, second, and third wafers 610, 640, 640'. The adjustment unit 694 will then send a control signal to the second platen 650 which may cause the control platen to move upward or downward relative to wafer 640'. Additionally, the control signal may require increasing or decreasing the heat applied to the second platen 650.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of bonding a first substrate and a second substrate, comprising:
while rotating first substrate with an adhesive mass thereon, and second substrate contacting the mass and overlying the first substrate, controlling a vertical height of a heated control platen spaced apart from and not contacting the second substrate so as to control a temperature of the adhesive mass, so as to at least one of:
bond the first and second substrates in alignment with one another, or achieve a sufficiently planar adhesive interface between the first and second substrates.

2. The method as claimed in claim 1, wherein the method further comprises:
receiving a first signal representative of a position of second substrate while rotating the first substrate with the adhesive mass thereon;
using the first signal to generate a control signal; and
using the control signal to adjust the vertical height of the second substrate.

3. The method as claimed in claim 2, wherein the step of using the control signal is performed so as to bond the first and second substrates in alignment with one another.

4. The method as claimed in claim 2, wherein the step of using the control signal is performed so as to achieve a sufficiently planar adhesive interface between the first and second substrates.

5. The method of claim 2, wherein the first signal is representative of a misalignment of the second substrate in a direction parallel to the top surface of the first substrate.

6. The method of claim 2, wherein the step of receiving a first signal includes generating the first signal by detecting positions of fiducials of the first and second rotating substrates.

7. The method of claim 2, wherein the step of receiving a first signal includes generating the first signal by detecting positions of notches of the first and second rotating substrates.

8. The method as claimed in claim 1, wherein the heated control platen rotates.

9. The method as claimed in claim 8, further comprising controlling the rotation of the heated control platen so as to influence the movement of the second wafer.

10. The method as claimed in claim 9, wherein the step of controlling the rotation of the heated control platen adjusts a position of the second wafer in at least one of a direction parallel to or a direction transverse to the surface of the first wafer.

11. The method as claimed in claim 1, wherein the heated control platen has a central portion overlying the second substrate and a wall extending from the central portion so as to create a chamber.

12. The method as claimed in claim 1, wherein the wall extends adjacent the edge of the second substrate.

13. The method as claimed in claim 12, wherein the wall extends adjacent the edge of the first substrate.

14. The method as claimed in claim 1, wherein the step of controlling the vertical height of the heated control platen includes changing the vertical height of the heated control platen while rotating the first and second substrates with the bonding material therebetween.

15. The method as claimed in claim 1, further comprising admitting a gas through an inlet during said rotating.

16. The method as claimed in claim 1, further comprising evacuating a volume surrounding said first and second substrates at least one of prior to or during said rotating.

17. A method of bonding substrates, comprising:
while rotating a first substrate with an adhesive mass thereon, and a second substrate contacting the mass and overlying the first substrate, receiving a first signal representative of a position of the second substrate;
using the first signal to generate a control signal and using the control signal to control a movement of a control platen adjacent to the second substrate so as to at least one of:
bond the first and second substrates in alignment with one another, or
achieve a sufficiently planar adhesive interface between the first and second substrates.

18. The method of claim 17, wherein the movement includes a rotational movement.

19. The method of claim 17, wherein the movement includes a vertical movement.

20. The method of claim 17, wherein the movement only includes a vertical movement.

21. The method of claim 20, wherein the control platen does not rotate.

22. The method of claim 17, wherein the control signal controls a rate of rotation of the control platen.

23. The method of claim 17, wherein the first signal is representative of a difference in relative position between the first and second substrates.

24. The method of claim 17, wherein the first signal is representative of rotational misalignment between the first and second substrates.

25. The method of claim 17, wherein the first signal is representative of a misalignment of the first substrate in a direction parallel to the top surface of the second substrate.

26. The method of claim 23, wherein the step of receiving a first signal includes generating the first signal by detecting positions of fiducials of the first and second rotating substrates.

27. The method of claim 23, wherein the step of receiving a first signal includes generating the first signal by detecting positions of notches of the first and second rotating substrates.
wherein notches in the first substrate and second substrate are used to determine the relative position between the first and second substrates.

28. The method as claimed in claim 17, wherein the step of using the control signal is performed so as to bond the first and second substrates in alignment with one another.

29. The method as claimed in claim 17, wherein the step of using the control signal is performed so as to achieve a sufficiently planar adhesive interface between the first and second substrates.

30. A method of bonding a first wafer and a second wafer, comprising:
while rotating first wafer with an adhesive mass thereon, and second wafer contacting the mass and overlying the first substrate, receiving a first signal representative of a position of second wafer;
using the first signal to generate a control signal, and using the control signal to adjust the position of second wafer by controlling a vertical height of a control platen adjacent to second wafer so as to control a movement of air or gas between second wafer and a control platen, so as to at least one of:
bond the first and second substrates in alignment with one another, or achieve a sufficiently planar adhesive interface between the first and second wafers.

31. The method as claimed in claim 30, wherein the step of using the control signal is performed so as to bond the first and second wafers in alignment with one another.

32. The method as claimed in claim 31, wherein the step of using the control signal is performed so as to achieve a sufficiently planar adhesive interface between the first and second wafers.

* * * * *